United States Patent
Lin et al.

(10) Patent No.: US 11,206,735 B2
(45) Date of Patent: Dec. 21, 2021

(54) FLEXIBLE CIRCUIT BOARD

(71) Applicant: CHIPBOND TECHNOLOGY CORPORATION, Hsinchu (TW)

(72) Inventors: Yin-Chen Lin, Miaoli County (TW); Hui-Yu Huang, Hsinchu (TW); Chih-Ming Peng, Taichung (TW); Chun-Te Lee, Hsinchu County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/160,483

(22) Filed: Jan. 28, 2021

(65) Prior Publication Data
US 2021/0267049 A1    Aug. 26, 2021

(30) Foreign Application Priority Data

Feb. 26, 2020   (TW) .................................. 109106347

(51) Int. Cl.
   *H05K 1/02*       (2006.01)
(52) U.S. Cl.
   CPC ......... *H05K 1/0281* (2013.01); *H05K 1/0266* (2013.01); *H05K 1/0274* (2013.01)
(58) Field of Classification Search
   CPC ... H05K 1/0281; H05K 1/0266; H05K 1/0274
   See application file for complete search history.

(56) References Cited

U.S. PATENT DOCUMENTS

| | | | |
|---|---|---|---|
| 6,300,997 B1 * | 10/2001 | Saito | G02F 1/1345 349/149 |
| 7,732,933 B2 * | 6/2010 | Chung | H01L 24/06 257/779 |
| 10,211,142 B1 * | 2/2019 | Chen | H01L 23/49838 |
| 10,304,764 B2 * | 5/2019 | Chung | H01L 23/4985 |
| 2004/0242027 A1 * | 12/2004 | Tanokura | H01R 4/027 439/60 |
| 2005/0121779 A1 * | 6/2005 | Saimen | H01L 21/67092 257/724 |

(Continued)

FOREIGN PATENT DOCUMENTS

| TW | I351137 | 10/2011 |
|---|---|---|
| TW | 201842130 A | 12/2018 |

OTHER PUBLICATIONS

Taiwanese Office Action dated Nov. 3, 2021 for Taiwanese Patent Application No. 109106347, 5 pages.

*Primary Examiner* — Hoa C Nguyen
(74) *Attorney, Agent, or Firm* — Demian K. Jackson; Jackson IPG PLLC (57) ABSTRACT

A flexible circuit board includes a flexible light-permeable carrier, a circuit layer, a mark and a stiffener. The circuit layer and the mark are located on a top surface of the flexible light-permeable carrier. A predetermined area and a stiffener mounting area corresponding to each other are defined on the top surface and a bottom surface of the flexible light-permeable carrier, respectively. The mark is opaque to create a shadow mark having a longitudinal reference side and a lateral reference side on the bottom surface. The stiffener is adhered to the stiffener mounting area defined on the bottom surface by aligning with the longitudinal reference side and the lateral reference side of the shadow mark.

20 Claims, 5 Drawing Sheets

(56) References Cited

U.S. PATENT DOCUMENTS

| | | | |
|---|---|---|---|
| 2006/0181299 A1* | 8/2006 | Hirae | H01L 23/4985 324/762.04 |
| 2008/0203563 A1* | 8/2008 | Takahashi | H01L 23/544 257/737 |
| 2010/0109690 A1* | 5/2010 | Sasaki | G01R 31/2884 324/762.06 |
| 2013/0248863 A1* | 9/2013 | Tang | H01L 22/32 257/48 |
| 2016/0334463 A1* | 11/2016 | Lim | G01R 31/2884 |
| 2020/0045111 A1 | 2/2020 | Kannan et al. | |

* cited by examiner

FLEXIBLE CIRCUIT BOARD

FIELD OF THE INVENTION

This invention relates to a flexible circuit board, and more particularly to a flexible circuit board having a stiffener.

BACKGROUND OF THE INVENTION

In order to assembly printed circuit board (PCB) on electrical product rapidly, a connector, e.g. plug connector or flip lock connector, is provided to connect a PCB with a flexible printed circuit (FPC). However, the FPC with warpage is not easy to be inserted into the connector.

SUMMARY

One object of the present invention is to provide a mark on a top surface of a flexible light-permeable carrier, the mark is opaque to create a shadow mark on a bottom surface of the flexible light-permeable carrier. A stiffener is aligned with the shadow mark to be attached to the bottom surface and provided to increase stiffness of a flexible circuit board and suppress warpage. Accordingly, the flexible circuit board can be inserted into a connector easily for electrical connection.

A flexible circuit board of the present invention includes a flexible light-permeable carrier, a circuit layer, a first mark and a stiffener. A chip mounting area, a circuit area and a predetermined area are defined on a top surface of the flexible light-permeable carrier, the circuit area is located between the chip mounting area and the predetermined area. The predetermined area includes a first retained part and a first removable part, and the first removable part is able to be removed in a cutting procedure. A stiffener mounting area is defined on a bottom surface of the flexible light-permeable carrier and corresponds to the predetermined area defined on the top surface. The circuit layer is located on the top surface and includes wires that each has an inner lead, a wire body and an outer lead. Both ends of the wire body are connected to the inner lead and the outer lead respectively, the inner lead is located on the chip mounting area, the wire body is located on the circuit area, and the outer lead is located on the first retained part of the predetermined area. The first mark is located on the top surface and at one side of the predetermined area. The first mark is opaque to create a first shadow mark on the bottom surface. The first shadow mark includes a first longitudinal reference side along a longitudinal direction and a first lateral reference side along a lateral direction intersecting the longitudinal direction. The stiffener is located on the bottom surface and includes a first longitudinal edge and a lateral edge connected with each other. The stiffener is configured to be adhered to the stiffener mounting area defined on the bottom surface by aligning the first longitudinal edge and the lateral edge of the stiffener with the first longitudinal reference side and the first lateral reference side of the first shadow mark, respectively.

In the present invention, the first mark located on the top surface is provided to create the first shadow mark on the bottom surface such that the stiffener can be aligned with the first longitudinal reference side and the first lateral reference side of the first shadow mark to be accurately adhered to the stiffener mounting area defined on the bottom surface. The stiffness of the flexible circuit board of the present invention is enhanced by the stiffener.

DETAILED DESCRIPTION OF THE INVENTION

Figure 1:
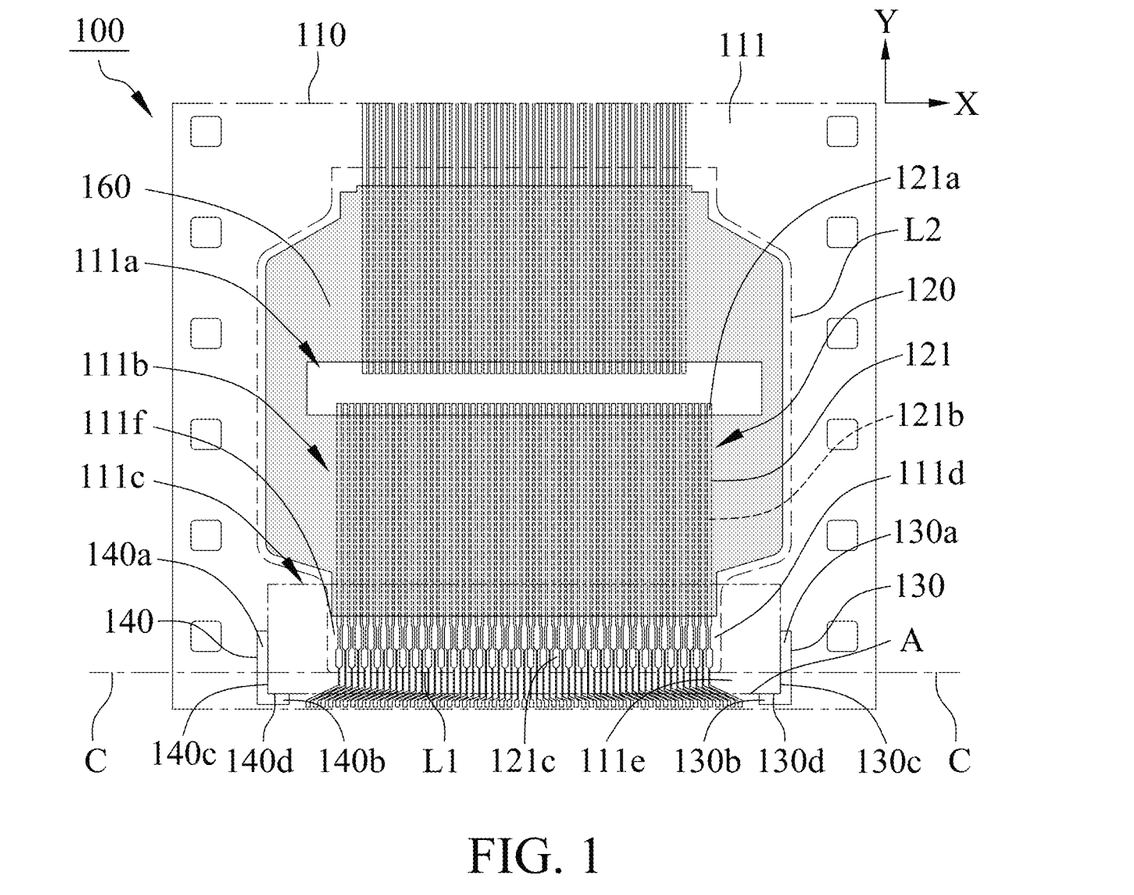
FIG. 1 is a top view diagram illustrating a flexible circuit board in accordance with a first embodiment of the present invention.
Figure 2:
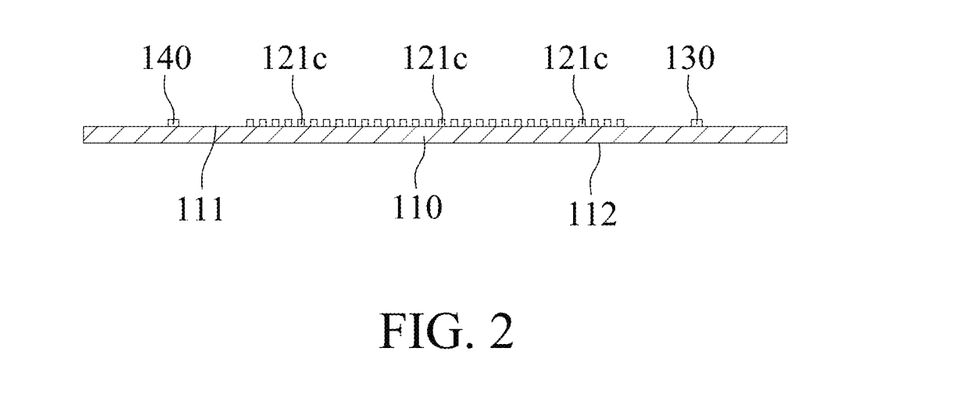
FIG. 2 is a cross-section view of FIG. 1.
Figure 3:
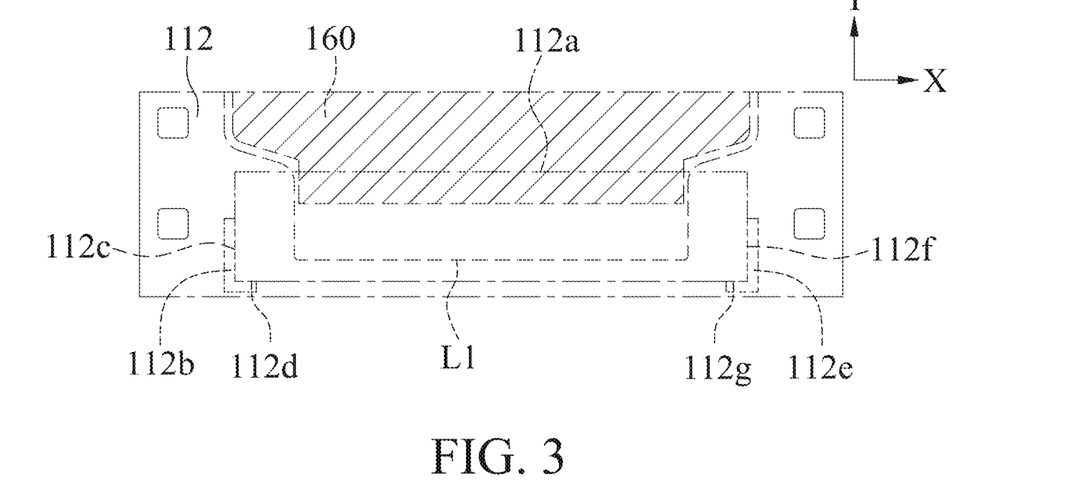
FIG. 3 is a bottom view diagram illustrating a part of the flexible circuit board in accordance with the first embodiment of the present invention.

With reference to FIGS. 1 to 5, a flexible circuit board 100 in accordance with a first embodiment of the present invention includes a flexible light-permeable carrier 110, a circuit layer 120, a first mark 130 and a stiffener 150. As shown in FIG. 1, a chip mounting area 111a, a circuit area 111b and a predetermined area 111c are defined on a top surface 111 of the flexible light-permeable carrier 110. The circuit area 111b is located between the chip mounting area 111a and the predetermined area 111c, and a part of the predetermined area 111c overlaps the circuit area 111b. The predetermined area 111c is separated into a first retained part 111d and a first removable part 111e according to a lateral predetermined cut line L1 passing through the predetermined area 111c. The lateral predetermined cut line L1 is located between the first retained part 111d and the first removable part 111e, in other words, the first retained part 111d and the first removable part 111e are located at two sides of the lateral predetermined cut line L1, respectively. The first removable area 111e is able to be removed in a subsequent cutting procedure. With reference to FIGS. 1 and 3, a stiffener mounting area 112a is defined on a bottom surface 112 of the flexible light-permeable carrier 110 and it corresponds to the predetermined area 111c defined on the top surface 111.

With reference to FIG. 1, the circuit layer 120 is located on the top surface 111 and involves multiple wires 121 that each includes an inner lead 121a, a wire body 121b and an outer lead 121c. Both ends of the wire body 121b are connected to the inner lead 121a and the outer lead 121c, respectively. The inner lead 121a is located on the chip mounting area 111a and used to bond with a chip (not shown) mounted on the chip mounting area 111a, the wire body 121b is located on the circuit area 111b, and the outer lead 121c is located on the first retained part 111d of the predetermined area 111c. In this embodiment, the flexible circuit board 100 further includes a solder resist layer 160 that is located on the top surface 111 of the flexible light-permeable carrier 110 and covers the wire bodies 121b of the wires 121, and the inner leads 121a and the outer leads 121c of the wires 121 are exposed (not covered by the solder resist layer 160).

With reference to FIGS. 1 to 3, the first mark 130 is located on the top surface 111 of the flexible light-permeable carrier 110 and located at one side of the predetermined area 111c. In the first embodiment, the first mark 130 is provided to mark an end A of the first removable part 111e of the predetermined area 111c. The end A of the first removable part 111e of the predetermined area 111c is located outside the lateral predetermined cut line L1. Preferably, the flexible circuit board 100 further includes a second mark 140 that is also located on the top surface 111 and located at the other side of the predetermined area 111c. The second mark 140 is also provided to mark the end A of the first removable apart 111e of the predetermined area 111c. The first mark 130 has a first portion 130a and the second mark 140 has a second portion 140a along a longitudinal direction Y, and the first mark 130 has a second portion 130b and the second mark 140 has a fourth portion 140b along a lateral direction X intersecting the longitudinal direction Y.

With reference to FIGS. 1 and 3, the first mark 130 and the second mark 140 on the top surface 111 are opaque to create a first shadow mark 112b and a second shadow mark 112e on the bottom surface 112, respectively. Along the longitudinal direction Y, the first shadow mark 112b has a first longitudinal reference side 112c and the second shadow mark 112e has a second longitudinal reference side 112f. And along the lateral direction X, the first shadow mark 112b has a first lateral reference side 112d and the second shadow mark 112e has a second lateral reference side 112g. In the first embodiment, the first longitudinal reference side 112c and the first lateral reference side 112d of the first shadow mark 112b are created by a first side 130c of the first portion 130a and a second side 130d of the second portion 130b respectively, and the second longitudinal reference side 112f and the second lateral reference side 112g of the second shadow mark 112e are created by a third side 140c of the third portion 140a and a fourth side 140d of the fourth portion 140b respectively. Preferably, the first side 130c and the second side 130d are perpendicular to one another, and the third side 140c and the fourth side 140d are perpendicular to each other. In the first embodiment, a lateral imaginary line C extending outward from the lateral predetermined cut line L1 passes through the first portion 130a of the first mark 130 and the third portion 140a of the second mark 140, and is perpendicular to the first side 130c of the first portion 130a and the third side 140c of the third portion 140a. The lateral imaginary lone C is provided to check whether the first mark 130 and/or the second mark 140 is/are shifted.

In this embodiment, the first shadow mark 112b and the second shadow mark 112e are created by the first mark 130 and the second mark 140 that are located on the top surface 111 of the flexible light-permeable carrier 110 and provided to intercept light from a light source (not shown).

Figure 4:
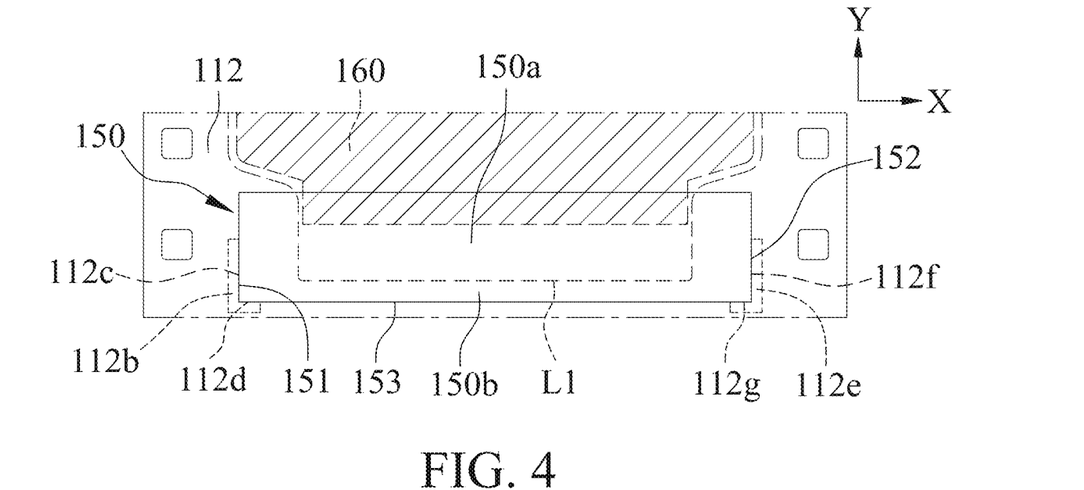
FIG. 4 is a bottom view diagram illustrating a part of the flexible circuit board in accordance with the first embodiment of the present invention.
Figure 5:
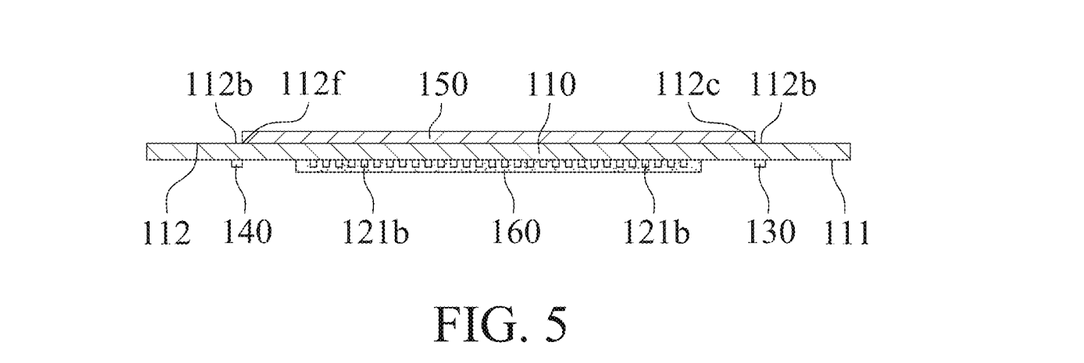
FIG. 5 is a cross-section view of FIG. 4.

With reference to FIGS. 3 to 5, the stiffener 150 is mounted on the bottom surface 112 and at least has a first longitudinal edge 151, a second longitudinal edge 152 and a lateral edge 153. Both ends of the lateral edge 153 are connected to the first longitudinal edge 151 and the second longitudinal edge 152, respectively. The first longitudinal edge 151 and the lateral edge 153 are aligned with the first longitudinal reference side 112c and the first lateral reference side 112d of the first shadow mark 112b to adhere the stiffener 150 to the stiffener mounting area 112a defined on the bottom surface 112.

With reference to FIG. 4, while light from the light source (not shown) is illuminated on the top surface 111 of the flexible light-permeable carrier 110, a light leakage may be observed between the first longitudinal edge 151 and the first longitudinal reference side 112c or between the lateral edge 153 and the first lateral reference side 112d from the bottom surface 112. The observation of light leakage indicates that the stiffener 150 is not accurately adhered to the stiffener mounting area 112, that is to say, the stiffener 150 is shifted on the bottom surface 112, including lateral shift and longitudinal shift.

With reference to FIGS. 3 and 4, similarly, the second longitudinal edge 152 and the lateral edge 153 of the stiffener 150 can be aligned with the second longitudinal reference side 112f and the second lateral reference side 112g of the second shadow mark 112e such that the stiffener 150 is able to be adhered to the stiffener mounting area 112a defined on the bottom surface 112 accurately. As there is a light leakage observed between the second longitudinal edge 152 and the second longitudinal reference side 112f or between the lateral edge 153 and the second lateral reference side 112g, it can be known that that the stiffener 150 is shift while adhering to the bottom surface 112.

With reference to FIGS. 1, 4 and 5, the lateral predetermined cut line L1 also passes through the stiffening mounting area 112a defined on the bottom surface 112 such that the stiffener 150 adhered to the stiffener mounting area 112a is separated into a second retained part 150a and a second removable part 150b. The second removable part 150b of the stiffener 150 is able to be removed in the subsequent cutting procedure. As shown in FIG. 1, a stiffening area 111f corresponding to the second retained part 150a of the stiffener 150 is defined on the top surface 111. In this embodiment, the stiffening area 111f overlaps the circuit area 111b and the first retained part 111d of the predetermined area 111c, the out lead 121c of each of the wires 121 and a part of the solder resist layer 160 are located on the stiffening area 111f. Because of the stiffener 150, the flexible circuit board 100 has an improved stiffness and is prevented from warpage while being inserted into an electrical connector (not shown). As a result, the flexible circuit board 100 can be inserted into the electrical connector easily and rapidly.

Figure 6:
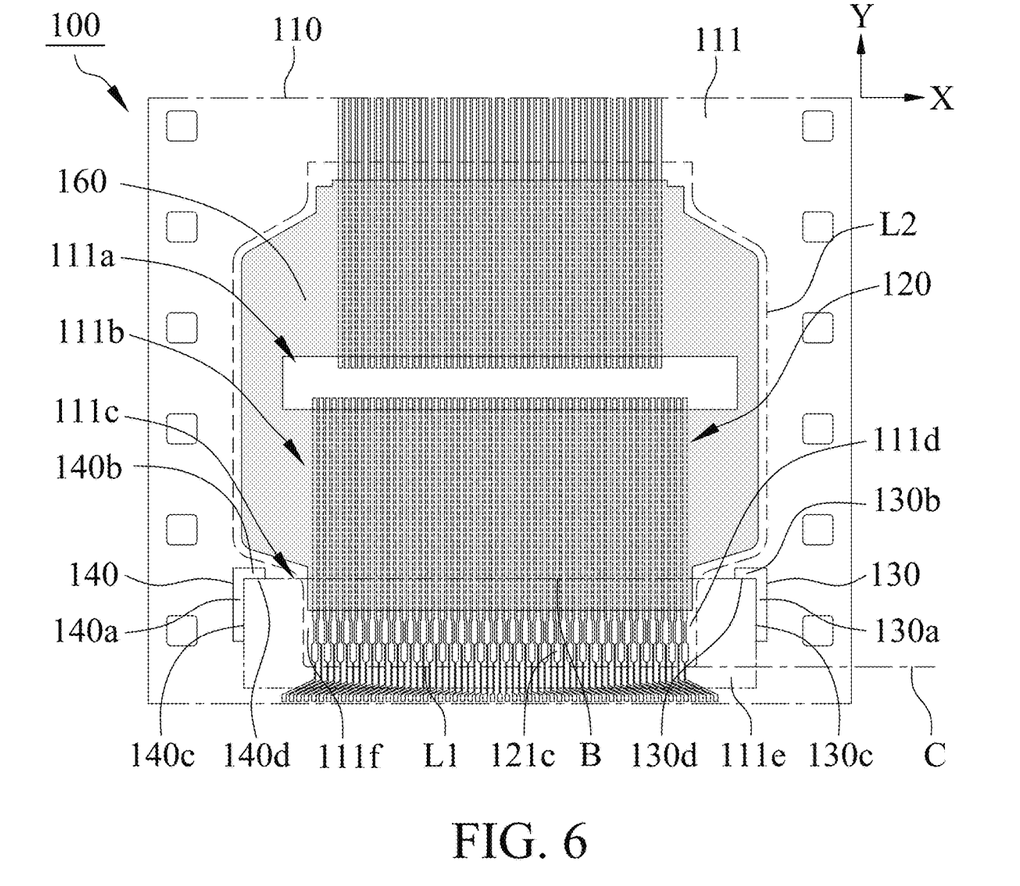
FIG. 6 is a top view diagram illustrating a flexible circuit board in accordance with a second embodiment of the present invention.
Figure 7:
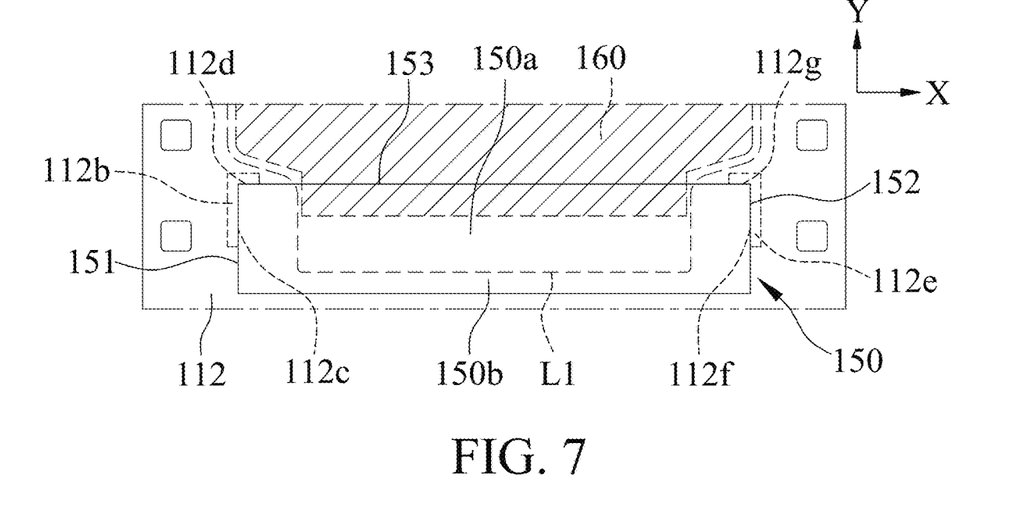
FIG. 7 is a bottom view diagram illustrating a part of the flexible circuit board in accordance with the second embodiment of the present invention.

FIGS. 6 and 7 show a second embodiment of the present invention. The first mark 130 and the second mark 140 of the second embodiment are provided to position a start B of the first retained part 111d of the predetermined area 111c, different to that of the first embodiment. The start B is located on the circuit area 111b.

Figure 8:
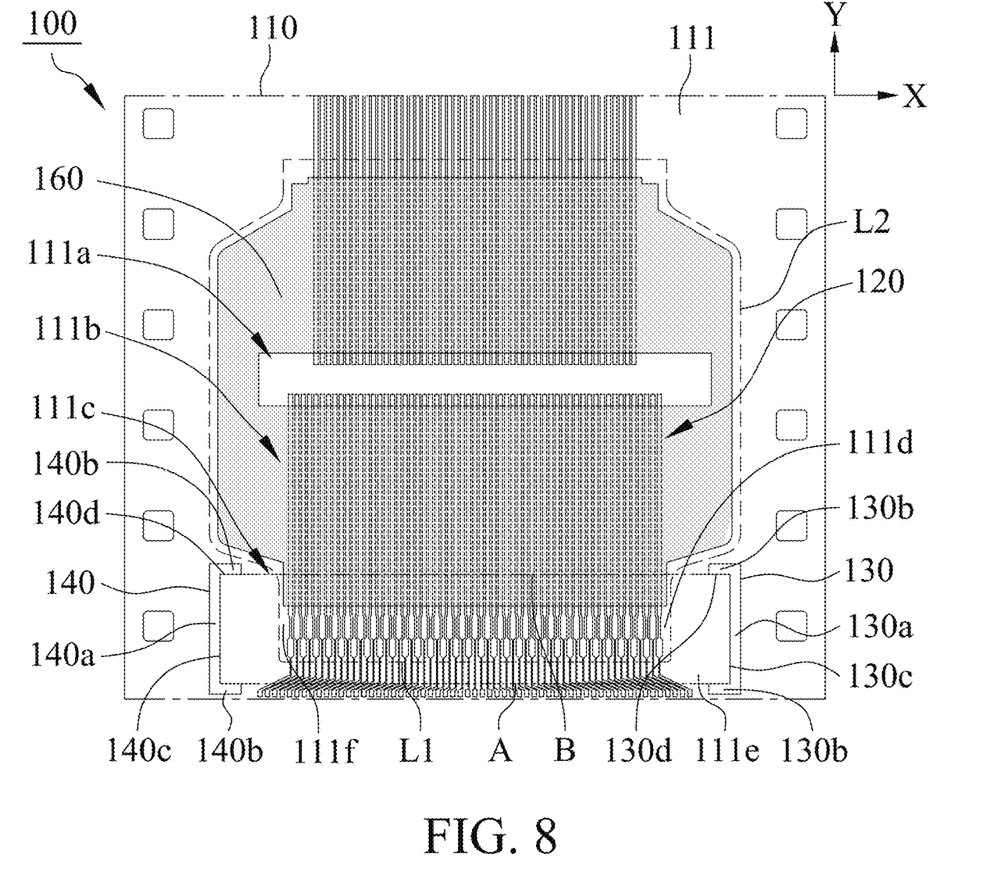
FIG. 8 is a top view diagram illustrating a flexible circuit board in accordance with a third embodiment of the present invention.
Figure 9:
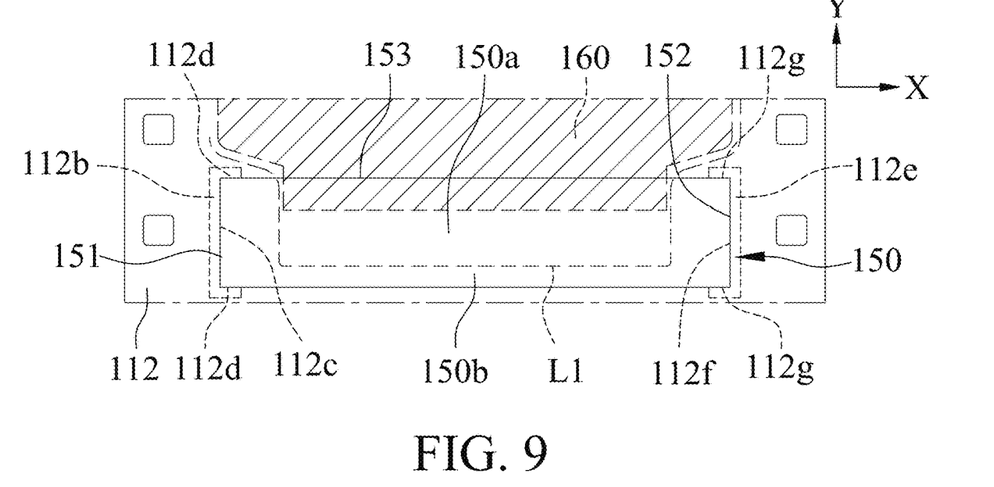
FIG. 9 is a bottom view diagram illustrating a part of the flexible circuit board in accordance with the third embodiment of the present invention.

With reference to FIGS. 8 and 9, the first mark 130 of a third embodiment includes one first portion 130a and two second portions 130b that are located on both ends of the first portion 130a respectively, and the second mark 140 of the third embodiment also includes one third portion 140a and two fourth portions 140b that are located on both ends of the third portion 140a respectively. Different to the first embodiment, the first mark 130 and the second mark 140 of the third embodiment are provided to mark the end A of the first removable part 111e of the predetermined area 111c and the start B of the first retained part 111d of the predetermined area 111c. In the third embodiment, the two second portions 130b of the first mark 130 are provided to position the end A of the first removable part 111e and the start B of the first retained part 111d respectively, and the two fourth portions 140*b* of the second mark 140 are provided to position the end A of the first removable part 111*e* and the start B of the first retained part 111*d* respectively.

Figure 10:
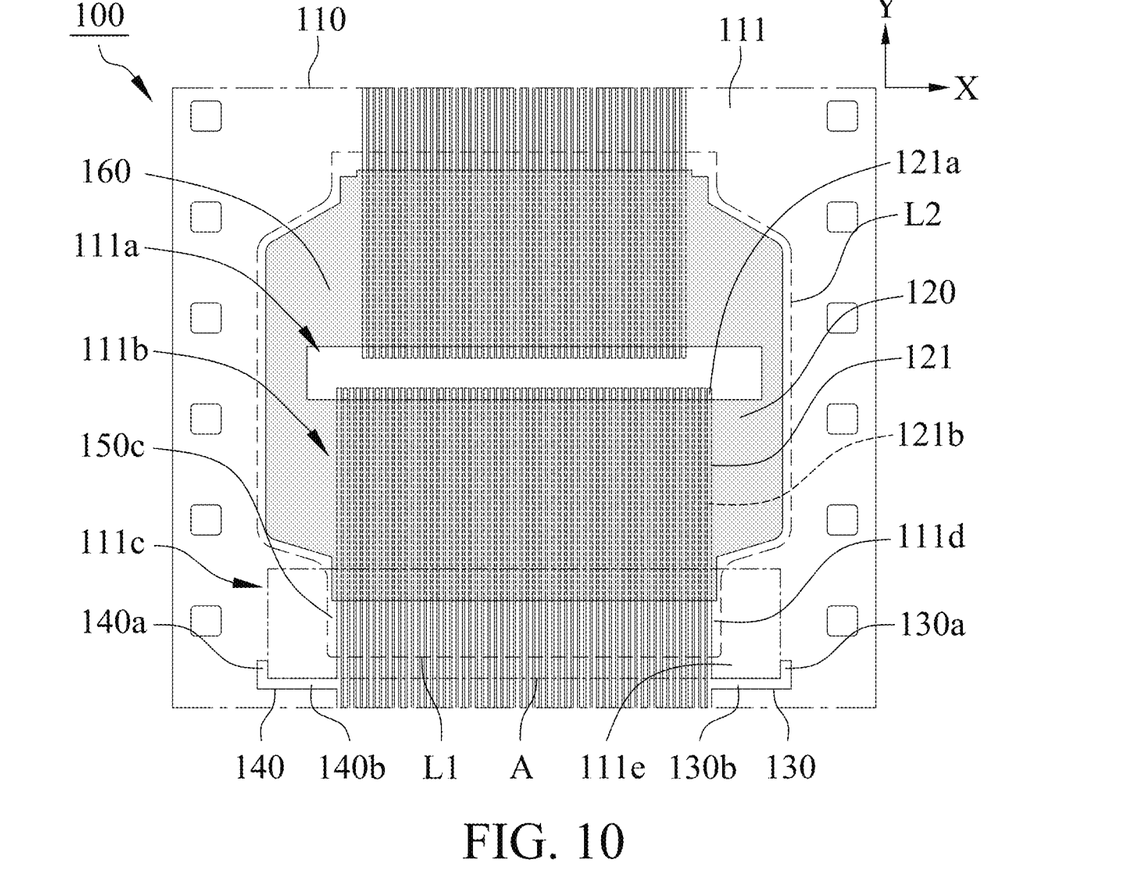
FIG. 10 is a top view diagram illustrating a flexible circuit board in accordance with a fourth embodiment of the present invention.
Figure 11:
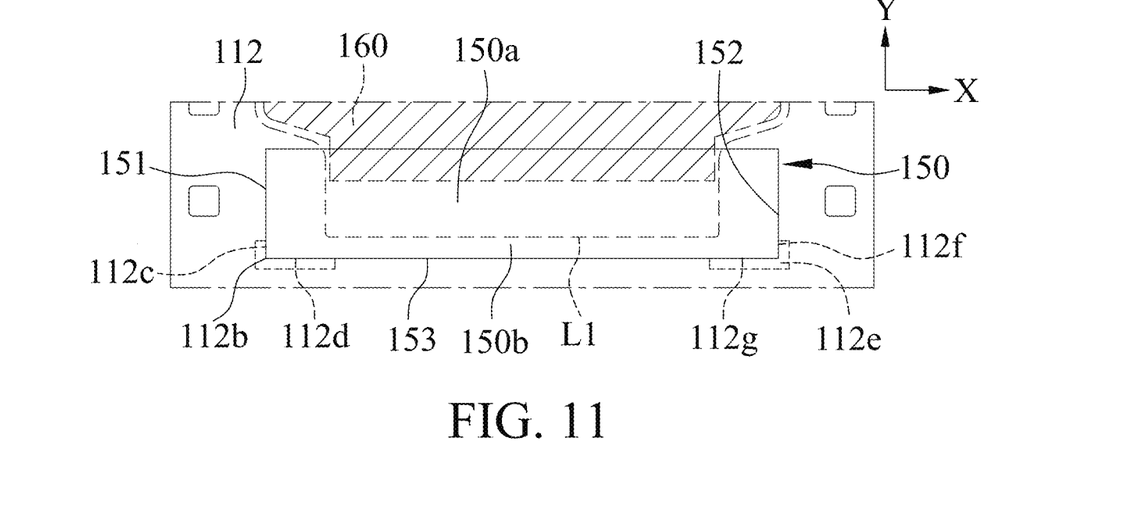
FIG. 11 is a bottom view diagram illustrating a part the flexible circuit board in accordance with the fourth embodiment of the present invention.

A fourth embodiment of the present invention is shown in FIGS. 10 and 11. In the fourth embodiment, the second portion 130*b* of the first mark 130 is connected to at least one of the wires 121, and the fourth portion 140*b* of the second mark 140 is connected to another one of the wires 121.

As shown in FIGS. 1, 6, 8 and 10, the first mark 130 and the second mark 140 are located outside the lateral predetermined cut line L1 and a longitudinal predetermined cut line L2 such that they are removed after the cutting procedure.

According to the first shadow mark 112*b* created by the first mark 130 that is opaque and located on the top surface 111, or the second shadow mark 112*e* created by the second mark 140 that is opaque and located on the top surface 111, the stiffener 150 of the present invention can be accurately adhered to the stiffener mounting area 112*a* defined on the bottom surface 112 to improve the stiffness of the flexible circuit board 100.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A flexible circuit board comprising:
a flexible light-permeable carrier including a top surface and a bottom surface, a chip mounting area, a circuit area and a predetermined area are defined on the top surface, the circuit area is located between the chip mounting area and the predetermined area, the predetermined area includes a first retained part and a first removable part that is configured to be removed in a cutting procedure, a stiffener mounting area is defined on the bottom surface and corresponds to the predetermined area defined on the top surface;
a circuit layer located on the top surface and including a plurality of wires, each of the plurality of wires includes an inner lead, a wire body and an outer lead, both ends of the wire body are connected to the inner lead and the outer lead respectively, the inner lead is located on the chip mounting area, the wire body is located on the circuit area and the outer lead is located on the first retained part of the predetermined area;
a first mark located on the top surface and at one side of the predetermined area, the first mark is opaque to be configured to create a first shadow mark on the bottom surface, the first shadow mark includes a first longitudinal reference side along a longitudinal direction and a first lateral reference side along a lateral direction intersecting the longitudinal direction; and
a stiffener located on the bottom surface and including a first longitudinal edge and a lateral edge connected with each other, wherein the stiffener is configured to be adhered to the stiffener mounting area defined on the bottom surface by aligning the first longitudinal edge and the lateral edge of the stiffener with the first longitudinal reference side and the first lateral reference side of the first shadow mark, respectively.

2. The flexible circuit board in accordance with claim 1, wherein a lateral predetermined cut line passes through the predetermined area defined on the top surface and the stiffener mounting area defined on the bottom surface, the lateral predetermined cut line is located between the first retained part and the first removable part of the predetermined area and between a second retained part and a second removable part of the stiffener, and the second removable part of the stiffener is configured to be removed in the cutting procedure.

3. The flexible circuit board in accordance with claim 2, wherein a stiffening area corresponding to the second retained part of the stiffener is defined on the top surface and overlaps the circuit area and the first retained part of the predetermined area.

4. The flexible circuit board in accordance with claim 3 further comprising a solder resist layer, wherein the solder resist layer is located on the top surface and configured to cover the wire body of each of the plurality of wires, a part of the solder resist layer is located on the stiffening area defined on the top surface.

5. The flexible circuit board in accordance with claim 2, wherein the first mark includes a first portion along the longitudinal direction and a second portion along the lateral direction, the first longitudinal reference side and the first lateral reference side of the first shadow mark are created by a first side of the first portion and a second side of the second portion respectively, the first side of the first portion is perpendicular to the second side of the second portion.

6. The flexible circuit board in accordance with claim 5, wherein a lateral imaginary line extending from the lateral predetermined cut line passes through the first portion of the first mark.

7. The flexible circuit board in accordance with claim 6, wherein the lateral imaginary line is perpendicular to the first side of the first portion of the first mark.

8. The flexible circuit board in accordance with claim 5, wherein the second portion of the first mark is connected to one of the plurality of wires.

9. The flexible circuit board in accordance with claim 5 further comprising a second mark, wherein the second mark is located on the top surface and at the other side of the predetermined area, the second mark is opaque to create a second shadow mark on the bottom surface, the second shadow mark includes a second longitudinal reference side along the longitudinal direction and a second lateral reference side along the lateral direction, the stiffener further includes a second longitudinal edge connecting with the lateral edge, wherein the stiffener is configured to be adhered to the stiffener mounting area defined on the bottom surface by aligning the second longitudinal edge and the lateral edge of the stiffener with the second longitudinal reference side and the second lateral reference side of the second shadow mark, respectively.

10. The flexible circuit board in accordance with claim 9, wherein the second mark includes a third portion along the longitudinal direction and a fourth portion along the lateral direction, the second longitudinal reference side and the second lateral reference side of the second shadow mark are created by a third side of the third portion and a fourth side of the fourth portion respectively, the third side of the third portion is perpendicular to the fourth side of the fourth portion.

11. The flexible circuit board in accordance with claim 10, wherein a lateral imaginary line extending from the lateral predetermined cut line passes through the third portion of the second mark.

12. The flexible circuit board in accordance with claim 11, wherein the lateral imaginary line is perpendicular to the third side of the third portion of the second mark.

13. The flexible circuit board in accordance with claim 10, wherein the fourth portion of the second mark is connected to one of the plurality of wires.

14. The flexible circuit board in accordance with claim 9, wherein the second mark is configured to position an end of the first removable part of the predetermined area, and the end of the first removable part is located outside the lateral predetermined cut line.

15. The flexible circuit board in accordance with claim 9, wherein the second mark is configured to position a start of the first retained part of the predetermined area, and the start of the first retained part is located on the circuit area.

16. The flexible circuit board in accordance with claim 9, wherein the second mark is configured to position an end of the first removable part of the predetermined area and a start of the first retained part of the predetermined area, the end of the first removable part is located outside the lateral predetermined cut line and the start of the first retained part is located on the circuit area.

17. The flexible circuit board in accordance with claim 2, wherein the first mark is configured to position an end of the first removable part of the predetermined area, and the end of the first removable part is located outside the lateral predetermined cut line.

18. The flexible circuit board in accordance with claim 2, wherein the first mark is configured to position an end of the first removable part of the predetermined area and a start of the first retained part of the predetermined area, the end of the first removable part is located outside the lateral predetermined cut line and the start of the first retained part is located on the circuit area.

19. The flexible circuit board in accordance with claim 1, wherein the first mark is configured to position a start of the first retained part of the predetermined area, and the start of the first retained part is located on the circuit area.

20. The flexible circuit board in accordance with claim 1, wherein the first mark is located outside a lateral predetermined cut line and a longitudinal predetermined cut line and is configured to be removed after the cut procedure.

* * * * *